(12) United States Patent
Jung et al.

(10) Patent No.: US 12,046,168 B2
(45) Date of Patent: Jul. 23, 2024

(54) DISPLAY DEVICE

(71) Applicant: Samsung Display Co., Ltd., Yongin-Si (KR)

(72) Inventors: Haegoo Jung, Hanam-si (KR); Yeon-Shil Jung, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/081,693

(22) Filed: Dec. 15, 2022

(65) Prior Publication Data

US 2023/0368709 A1 Nov. 16, 2023

(30) Foreign Application Priority Data

May 13, 2022 (KR) .................. 10-2022-0058784

(51) Int. Cl.
*H10K 59/131* (2023.01)
*G06F 3/041* (2006.01)
*G09G 3/00* (2006.01)

(52) U.S. Cl.
CPC .......... *G09G 3/006* (2013.01); *G06F 3/0412* (2013.01); *H10K 59/131* (2023.02); *G09G 2300/0408* (2013.01); *G09G 2300/0426* (2013.01); *G09G 2320/045* (2013.01); *G09G 2330/12* (2013.01)

(58) Field of Classification Search
CPC .......... G09G 3/006; G09G 2300/0408; G09G 2300/0426; G09G 2320/045; G09G 2330/12; G06F 3/0412; H10K 59/131
See application file for complete search history.

(56) References Cited

U.S. PATENT DOCUMENTS

| | | |
|---|---|---|
| 11,302,226 B2 | 4/2022 | Jung |
| 11,415,621 B2 | 8/2022 | Ye |
| 2011/0141042 A1 | 6/2011 | Kim et al. |
| 2016/0043010 A1* | 2/2016 | Kwak ................. H01L 22/14 438/15 |

(Continued)

FOREIGN PATENT DOCUMENTS

| CN | 110648618 B | 12/2020 |
|---|---|---|
| CN | 113903787 A | 1/2022 |

(Continued)

OTHER PUBLICATIONS

PCT/KR2023/004939, PCT-Search-Report dated on Jul. 27, 2023, 3 pages.

*Primary Examiner* — Temesghen Ghebretinsae
*Assistant Examiner* — Sosina Abebe
(74) *Attorney, Agent, or Firm* — Innovation Counsel LLP

(57) ABSTRACT

A display device includes a substrate including a display area, a hole area, a peripheral area, and a bending area, a printed circuit board disposed on the pad area, a first hole crack detection line and a second hole crack detection line disposed in the peripheral area and extending to the bending area and the pad area, a first transistor including a gate electrode connected to a first signal line to apply a first signal, a first electrode, and a second electrode connected to the first hole crack detection line, and a second transistor including a gate electrode connected to a second signal line to receive a second signal, a first electrode connected to a high voltage line applying a high voltage, and a second electrode connected to the first hole crack detection line.

24 Claims, 9 Drawing Sheets

(56) References Cited

U.S. PATENT DOCUMENTS

| | | | |
|---|---|---|---|
| 2016/0225312 A1* | 8/2016 | Byun | G09G 3/006 |
| 2016/0232826 A1* | 8/2016 | Cho | G09G 3/20 |
| 2016/0322451 A1* | 11/2016 | Park | H10K 71/70 |
| 2016/0372017 A1* | 12/2016 | Byun | G09G 3/20 |
| 2017/0270842 A1* | 9/2017 | Nam | H01L 27/124 |
| 2018/0033354 A1* | 2/2018 | Lee | G09G 3/006 |
| 2018/0158741 A1* | 6/2018 | Kim | H01L 22/32 |
| 2018/0158894 A1* | 6/2018 | Park | H10K 71/70 |
| 2018/0336808 A1* | 11/2018 | Lee | G09G 3/20 |
| 2018/0350284 A1* | 12/2018 | Park | G09G 3/006 |
| 2019/0019441 A1* | 1/2019 | Shin | H10K 59/00 |
| 2019/0057632 A1* | 2/2019 | Kim | G09G 3/3266 |
| 2019/0066595 A1* | 2/2019 | Kim | G09G 3/006 |
| 2020/0135595 A1* | 4/2020 | Kim | H01L 22/32 |
| 2020/0143722 A1* | 5/2020 | Lee | G09G 3/3648 |
| 2020/0242986 A1* | 7/2020 | Lee | G06F 1/1652 |
| 2020/0273919 A1* | 8/2020 | Ding | H10K 50/841 |
| 2020/0278312 A1* | 9/2020 | Jeong | G01R 31/2837 |
| 2021/0118345 A1* | 4/2021 | Jung | G09G 3/3225 |
| 2021/0202672 A1* | 7/2021 | Kim | H10K 59/124 |
| 2021/0257592 A1* | 8/2021 | Lee | G06F 3/04164 |
| 2021/0313414 A1 | 10/2021 | Park et al. | |
| 2021/0327319 A1 | 10/2021 | Lee et al. | |
| 2021/0367000 A1* | 11/2021 | Kim | G06F 3/0412 |
| 2022/0003810 A1* | 1/2022 | Ye | G06F 3/0412 |
| 2022/0114930 A1* | 4/2022 | Jiang | G09G 3/3208 |
| 2022/0129098 A1* | 4/2022 | Hu | G06F 3/044 |
| 2022/0137738 A1* | 5/2022 | Kim | H10K 59/131 345/174 |
| 2023/0044101 A1* | 2/2023 | Han | H10K 59/131 |
| 2023/0078619 A1* | 3/2023 | Chai | G06F 3/0412 345/174 |
| 2023/0132617 A1* | 5/2023 | Niu | H01L 27/0288 324/537 |

FOREIGN PATENT DOCUMENTS

| | | |
|---|---|---|
| CN | 112419949 B | 4/2022 |
| KR | 10-2011-0065957 A | 6/2011 |
| KR | 10-2018-0065061 A | 6/2018 |
| KR | 10-2020-0051099 A | 5/2020 |
| KR | 10-2020-0094873 A | 8/2020 |

\* cited by examiner

DISPLAY DEVICE

CROSS-REFERENCE TO RELATED APPLICATION

This application claims priority to and the benefit of Korean Patent Application No. 10-2022-0058784, filed on May 13, 2022, which is hereby incorporated by reference for all purposes as if fully set forth herein.

BACKGROUND

1. Field

Embodiments provide generally to display device. More particularly, embodiments relate to a display device providing visual information.

2. Description of the Related Art

With the development of information technology, the importance of a display device, which is a connection medium between a user and information, has been highlighted. For example, the use of display devices such as liquid crystal display device ("LCD"), organic light emitting display device ("OLED"), plasma display device ("PDP"), quantum dot display device or the like is increasing.

Meanwhile, when the display device is subjected to an impact, crack may occur in a substrate or in a layer stacked on the substrate. The crack may become larger over time or spread to another layer or other area, which may cause a defect in the display device. For example, a signal line such as a data line or a gate line may be disconnected or resistance of the signal line may be increased due to a crack, and moisture or the like may penetrate into an inside of the display device through the crack, thereby reducing element reliability. Accordingly, various problems such as non-emission of light or erroneous light emission of pixels of the display device may occur.

SUMMARY

Embodiments provide a display device capable of inspecting a crack of a hole formed in a hole area.

A display device according to an embodiment of the present disclosure may include a substrate including a display area on which a plurality of pixels are disposed, a hole area disposed in the display area, a peripheral area surrounding the display area, a pad area, and a bending area positioned between the peripheral area and the pad area in a plan view, a printed circuit board disposed on the pad area on the substrate, a first hole crack detection line disposed in the peripheral area on the substrate and extending to the bending area and the pad area, a second hole crack detection line disposed in the peripheral area on the substrate, extending to the bending area and the pad area, and electrically connected to the first hole crack detection line, a first transistor including a gate electrode connected to a first signal line to receive a first signal, a first electrode, and a second electrode connected to the first hole crack detection line, and a second transistor including a gate electrode connected to a second signal line to receive a second signal, a first electrode connected to a high voltage line for applying a high voltage, and a second electrode connected to the second hole crack detection line.

In an embodiment, when the display device is driven in a normal mode, a first signal having a low level may be applied to the gate electrode of the first transistor through the first signal line so that the first transistor is turned on, and a second signal having a high level may be applied to the gate electrode of the second transistor through the second signal line so that the second transistor is turned off.

In an embodiment, the first electrode of the first transistor may be connected to a ground line of the printed circuit board. When the display device is driven in the normal mode, a ground voltage may be applied to the first hole crack detection line and the second hole crack detection line through the printed circuit board.

In an embodiment, when the display device is driven in the normal mode, a low voltage may be applied to the first hole crack detection line and the second hole crack detection line through the printed circuit board.

In an embodiment, when the display device is driven in the normal mode, the first hole crack detection line and the second hole crack detection line may be in a floating state.

In an embodiment, when the display device is driven in an inspection mode, a first signal having a high level may be applied to the gate electrode of the first transistor through the first signal line so that the first transistor is turned off, and a second signal having a low level may be applied to the gate electrode of the second transistor through the second signal line so that the second transistor is turned on.

In an embodiment, when the display device is driven in the inspection mode, the high voltage may be applied to the first hole crack detection line and the second hole detection line through the high voltage line.

In an embodiment, the display device may further include a driving chip disposed in the pad area on the substrate. The diving chip may be connected to the first signal line that provides the first signal to the first signal line, and that provides the high voltage to the high voltage line through the printed circuit board.

In an embodiment, the display device may further include first connection lines disposed in the pad area on the substrate and that provides a data signal to the pixels through the driving chip and a second connection line disposed in the pad area on the substrate and that provides a driving voltage to the pixels through the printed circuit board.

In an embodiment, in the pad area, the first hole crack detection line may be disposed between the first connection lines and the second connection line in a plan view.

In an embodiment, the display device may further include a detection line disposed in the display area on the substrate, including a first end and a second end, and adjacent to the hole area to surround a periphery of the hole area.

In an embodiment, the first end of the detection line may be electrically connected to the first hole crack detection line and the second end of the detection line may be electrically connected to the second hole crack detection line.

In an embodiment, the display device may further include a semiconductor element including an active layer disposed in the display area on the substrate, a gate electrode overlapping a channel area of the active layer, a source electrode connected to a source area of the active layer, and a drain electrode connected to a drain area of the active layer, a connection electrode disposed on the semiconductor element and connected to the semiconductor element, and a touch sensing structure including a sensing connection pattern disposed on the connection electrode and a sensing electrode pattern disposed on the sensing connection pattern.

In an embodiment, each of the first hole crack detection line and the second hole crack detection line may include a first conductive pattern disposed in the pad area on the substrate, a bridge pattern disposed in the bending area on the substrate, extending to a portion of the peripheral area and a portion of the pad area, and connected to the first conductive pattern, and a second conductive pattern disposed in peripheral area on the substrate and connected to the bridge pattern.

In an embodiment, the first conductive pattern may be disposed on a same layer as the source electrode and the drain electrode, the bridge pattern may be disposed on a same layer as the connection electrode, the second conductive pattern may be disposed on a same layer as the sensing electrode pattern.

A display device according to another embodiment of the present disclosure may include a substrate including a display area on which a plurality of pixels are disposed, a hole area disposed in the display area, a peripheral area surrounding the display area, a pad area, and a bending area positioned between the peripheral area and the pad area in a plan view, a driving chip disposed in the pad area on the substrate, a first hole crack detection line disposed in the peripheral area on the substrate, extending to the bending area and the pad area, and directly connected to the driving chip, and a second hole crack detection line disposed in the peripheral area on the substrate, extending to the bending area and the pad area, and electrically connected to the first hole crack detection line.

In an embodiment, when the display device is driven in a normal mode, a low voltage may be applied to the first hole crack detection line and the second hole crack detection line through the driving chip.

In an embodiment, when the display device is driven in a normal mode, the first hole crack detection line and the second hole crack detection line may be connected to a ground line of the driving chip or may be in a floating state.

In an embodiment, when the display device is driven in an inspection mode, a high voltage may be applied to the first hole crack detection line and the second hole crack detection line through the driving chip.

A display device according to still another embodiment of the present disclosure may include a substrate including a display area on which a plurality of pixels are disposed, a hole area disposed in the display area, a peripheral area surrounding the display area, a pad area, and a bending area positioned between the peripheral area and the pad area in a plan view, a first hole crack detection line disposed in the peripheral area on the substrate and extending to the bending area and the pad area, a second hole crack detection line disposed in the peripheral area on the substrate, extending to the bending area and the pad area, and electrically connected to the first hole crack detection line, and a transistor including a gate electrode connected to a signal line to receive a signal, a first electrode connected to a high voltage line for applying a high voltage, and a second electrode connected to the first hole crack detection line.

In an embodiment, when the display device is driven in a normal mode, a signal having a high level may be applied to the gate electrode of the transistor through the signal line so that the transistor is turned off.

In an embodiment, when the display device is driven in a normal mode, the first hole crack detection line and the second hole crack detection line may be in a floating state.

In an embodiment, when the display device is driven in an inspection mode, a signal having a low level may be applied to the gate electrode of the transistor through the signal line so that the transistor is turned on.

In an embodiment, when the display device is driven in an inspection mode, the high voltage may be applied to the first hole crack detection line and the second hole crack detection line through the high voltage line.

In an embodiment, the display device may further include a driving chip disposed in the pad area on the substrate and a printed circuit board disposed on the pad area on the substrate. The driving chip may be connected to the signal line that provides the signal to the signal line and that provides the high voltage to the high voltage line through the printed circuit board.

In a display device according to an embodiment of the present disclosure, when the display device is driven in a normal mode, which is a mode generally used by a user, a low voltage may be applied to a first hole crack detection line and a second hole crack detection line, when the display device is driven in an inspection mode for inspecting crack in a hole formed in a hole area, a high voltage may be applied to the first hole crack detection line and the second hole crack detection line. Accordingly, corrosion of the first and second hole crack detection lines for inspecting a crack in the hole area of the display device that may occur when driving for a long time in a high temperature and high humidity environment and a general user environment may be improved. In addition, corrosion of driving signal lines positioned adjacent to the first and second hole crack detection lines caused by driving for a long time in a high temperature and high humidity environment and a general user environment may be improved.

BRIEF DESCRIPTION OF THE DRAWINGS

Illustrative, non-limiting embodiments will be more clearly understood from the following detailed description in conjunction with the accompanying drawings.

DETAILED DESCRIPTION OF THE EMBODIMENTS

Figure 1:
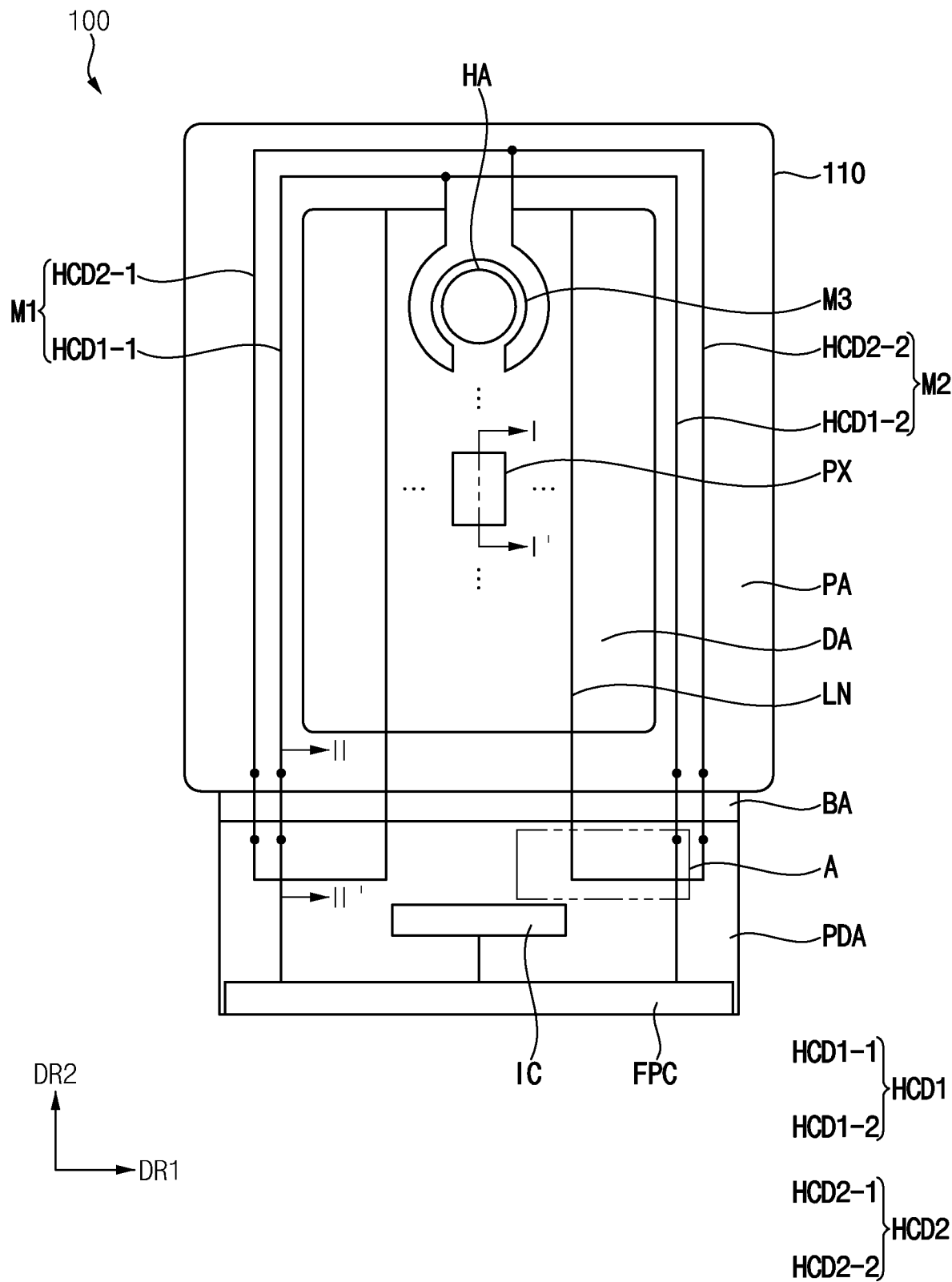
FIG. 1 is a plan view illustrating a display device according to an embodiment.

Hereinafter, a display device according to embodiments of the present disclosure will be explained in detail with reference to the accompanying drawings. The same reference numerals are used for the same components in the drawings, and redundant descriptions of the same components will be omitted.

Figure 2:
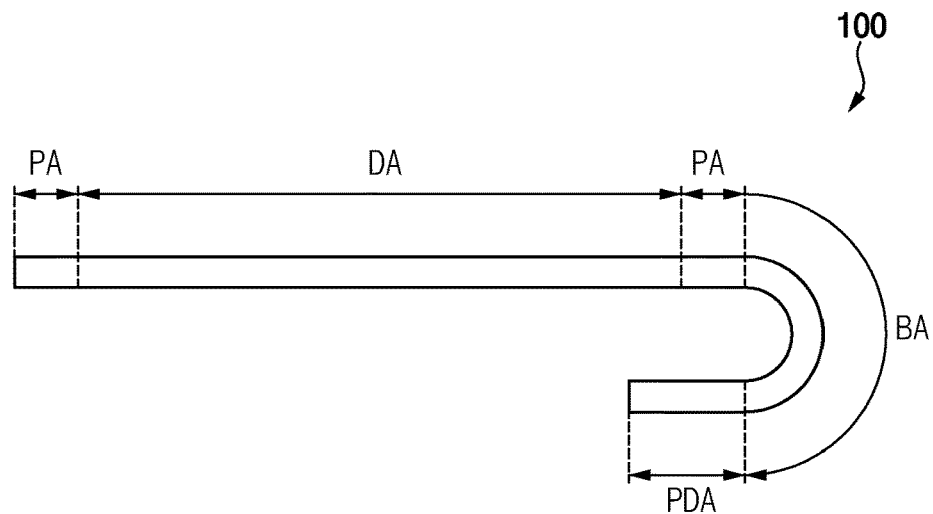
FIG. 2 is a diagram illustrating a bent shape of the display device of FIG. 1.
Figure 3:
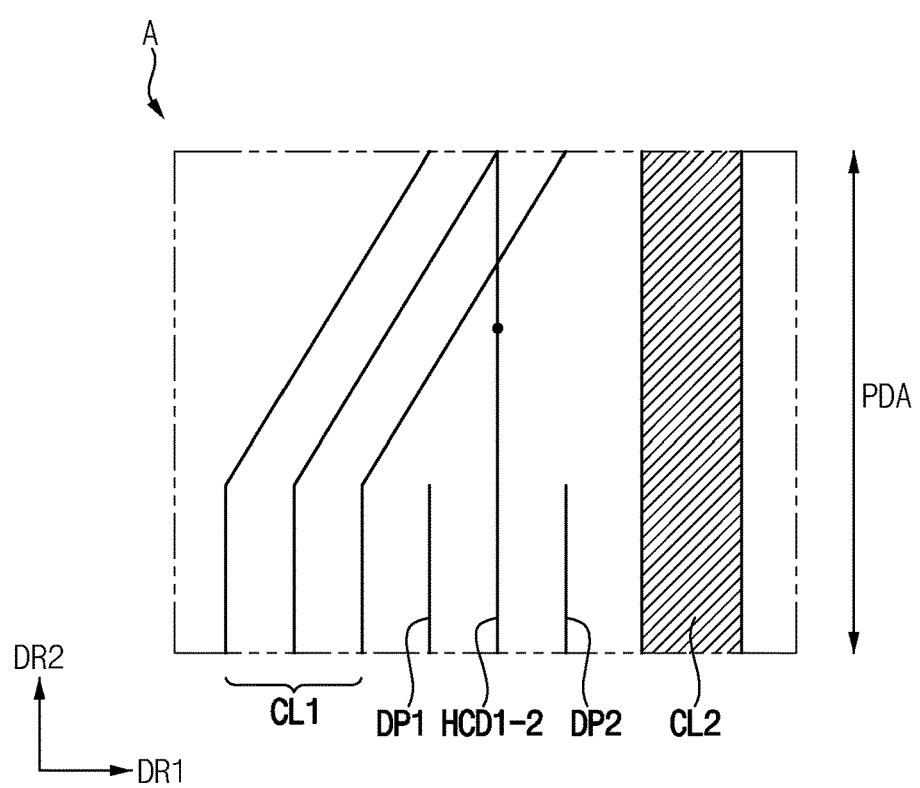
FIG. 3 is a plan view illustrating an enlarged area "A" of FIG. 1.

FIG. 1 is a plan view illustrating a display device according to an embodiment. FIG. 2 is a diagram illustrating a bent shape of the display device of FIG. 1. FIG. 3 is a plan view illustrating an enlarged area "A" of FIG. 1. For example, FIG. 3 is an enlarged plan view of a right portion of a pad area PDA of the display device 100 of FIG. 1.

Referring to FIGS. 1, 2, and 3, the display device 100 according to an embodiment may include a substrate 110, a plurality of pixels PX, a first sensing line M1, a second detection line M2, a third detection line M3, a driving chip IC, and a printed circuit board FPC.

The substrate 110 may include a display area DA, a hole area HA, a peripheral area PA, a bending area BA, and a pad area PDA. The peripheral area PA may surround at least a portion of the display area DA. For example, the peripheral area PA may entirely surround the display area DA. The display area DA may be an area that generates light or displays an image by adjusting transmittance of light provided from an external light source. The peripheral area PA may be an area that does not display an image.

The plurality of pixels PX each including a semiconductor element and a light emitting element may be disposed in the display area DA on the substrate 110. The plurality of pixels PX may generate light according to a driving signal. The plurality of pixels PX may be arranged in a first direction DR1 and a second direction DR2 crossing the first direction DR1. Here, the second direction DR2 may be a direction substantially perpendicular to the first direction DR1.

Lines LN connected to the plurality of pixels PX may be further disposed in the display area DA on the substrate 110. For example, the lines LN may include a data line, a gate line, a power line, and the like.

As illustrated in FIG. 2, the bending area BA may extend from one side of the peripheral area PA and may be bent downward. That is, when the bending area BA is bent along the first direction DR1, the pad area PDA may be positioned on a lower surface of the display device 100. The pad area PDA may extend from the bending area BA and may be positioned under the display area DA or the peripheral area PA. When the display device 100 is unfolded, the bending area BA may be positioned between the display area DA and the pad area PDA.

First connection lines CL1 may be disposed in the pad area PDA on the substrate 110. The first connection lines CL1 may provide a data signal to the data lines disposed in the display area DA through the driving chip IC. The data lines may transmit the data signal to the plurality of pixels PX.

A second connection line CL2 may be disposed in the pad area PDA on the substrate 110. The second connection line CL2 may provide a driving voltage to the power lines disposed in the display area DA through the printed circuit board FPC. The power lines may transmit the driving voltage to the plurality of pixels PX.

Dummy patterns DP1 and DP2 may be disposed in the pad area PDA on the substrate 110. The dummy patterns DP1 and DP2 may be disposed to be spaced apart from each other in the first direction DR1. Each of the dummy patterns DP1 and DP2 may extend in the second direction DR2 perpendicular to the first direction DR1. The dummy patterns DP1 and DP2 may be disposed between the first connection line CL1 and the second connection line CL2 in a plan view.

The hole area HA may be positioned in the display area DA. A hole may be formed in the hole area HA. The hole may pass through the substrate 110. In an embodiment, a functional module may be disposed under the substrate 110 corresponding to the hole. The functional module may receive external light passing through the hole or transmit a signal such as infrared ray or ultrasonic wave.

For example, the functional module may include a camera module for photographing (or recognizing) an image of an object positioned in front of the display device 100, a face recognition sensor module to detect the user's face, a pupil recognition sensor module to detect the user's pupils, an acceleration sensor module and a geomagnetic sensor module for determining the movement of the display device 100, a proximity sensor module and an infrared sensor module for detecting a presence of nearby objects without any physical contact, an illuminance sensor module to measure the degree of external brightness, and the like.

In an embodiment, the hole area HA may have a circular shape in a plan view. However, the present disclosure is not limited thereto, and the hole area HA may have a polygonal shape or an elliptical shape in a plan view. In addition, although FIG. 1 illustrates that one hole area HA having a hole is positioned in the display area DA, but the present disclosure is not limited thereto. For example, a plurality of hole areas each having a hole may be positioned in the display area DA.

The third detection line M3 adjacent to the hole area HA may be disposed in the display area DA on the substrate 110. The third detection line M3 may be separated into one end (i.e., a first end) and the other end (i.e., a second end) to surround a periphery of the hole area HA and may be disposed adjacent to the hole area HA. The third detection line M3 may be a line for inspecting cracks formed in the hole area HA in layers forming the display device 100.

The first detection line M1 and the second detection line M2 may be disposed in the peripheral area PA, the bending area BA, and the pad area PDA on the substrate 110. The first detection line M1 may include a (1-1)-th hole crack detection line HCD1-1 and a (2-1)-th hole crack detection line HCD2-1. One end of the (1-1)-th hole crack detection line HCD1-1 may be electrically connected to the printed circuit board FPC, and the other end of the (1-1)-th hole crack detection line HCD1-1 may be electrically connected to one end of the third detection line M3. One end of the (2-1)-th hole crack detection line HCD2-1 may be electrically connected to the lines LN, and the other end of the (2-1)-th hole crack detection line HCD2-1 may be electrically connected to the other end of the third detection line M3.

The (1-1)-th hole crack detection line HCD1-1 and the (2-1)-th hole crack detection line HCD2-1 may be positioned in the lower, left, and upper peripheral areas PA with respect to the display area DA. The (1-1)-th hole crack detection line HCD1-1 and the (2-1)-th hole crack detection line HCD2-1 may extend in parallel along an edge of the display area DA.

The second detection line M2 may include a (1-2)-th hole crack detection line HCD1-2 and a (2-2)-th hole crack detection line HCD2-2. One end of the (1-2)-th hole crack detection wiring HCD1-2 may be electrically connected to the printed circuit board FPC, and the other end of the (1-2)-th hole crack detection line HCD1-2 may be electrically connected to the one end of the third detection line M3. One end of the (2-2)-th hole crack detection line HCD2-2 may be electrically connected to the lines LN, and the other end of the (2-2)-th hole crack detection line HCD2-2 may be connected to the other end of the third detection wiring M3.

The (1-2)-th hole crack detection line HCD1-2 and the (2-2)-th hole crack detection line HCD2-2 may be positioned in the lower, right, and upper peripheral areas PA with respect to the display area DA. The (1-2)-th hole crack detection wiring HCD1-2 and the (2-2)-th hole crack detection line HCD2-2 may extend in parallel along the edge of the display area DA.

The display device 100 may be driven in a normal mode, which is a mode generally used by a user, or an inspection mode in which the cracks formed in the hole area HA in the layers forming the display device 100 are inspected. When the display device 100 is driven in the normal mode, the driving chip IC may output the data signal. When the display device 100 is driven in the inspection mode, the driving chip IC may provide a voltage (e.g., a high voltage) to the printed circuit board FPC. In this case, the driving chip IC may not output the data signal.

When the display device 100 is driven in the inspection mode, a voltage (e.g., the high voltage) may be applied to the (1-1)-th hole crack detection line HCD1-1 and the (1-2)-th hole crack detection line HCD1-2 through the printed circuit board FPC. The voltage may be applied to the lines LN disposed in the display area DA through the third detection line M3, the (2-1)-th hole crack detection line HCD2-1, and the (2-2)-th hole crack detection line HCD2-2.

When the display device 100 is driven in the inspection mode and no crack is formed in the hole area HA in the layers forming the display device 100, the level of the voltage passing through the third detection line M3 may have a predetermined value.

When the display device 100 is driven in the inspection mode and a crack is formed in the hole area HA in the layers forming the display device 100, the level of the voltage passing through the third detection line M3 may decrease. In this case, the display area DA may display a bright vertical stripe pattern. Through this, the crack formed in the hole area HA in the layers forming the display device 100 may be detected.

In an embodiment, the (1-2)-th hole crack detection line HCD1-2 may be disposed between the first connection line CL1 that provides the data signal to the data lines and the second connection lines CL2 that provides the driving voltage to the power lines in a plan view. That is, the (1-2)-th hole crack detection line HCD1-2 may be disposed adjacent to the second connection line CL2. In other words, the (1-2)-th hole crack detection line HCD1-2 may be disposed between the dummy patterns DP1 and DP2 in a plan view. However, although the (1-2)-th hole crack detection line HCD1-2 has been described as an example in FIG. 3, the present disclosure is not limited thereto. For example, the (1-1)-th hole crack detection line HCD1-1 may also be disposed between a first connection line CL1 that provides the data signal to the data lines and disposed in the pad area PDA, and a second connection line CL2 that provides the driving voltage to the power lines and disposed in the pad area PDA in a plan view.

The printed circuit board FPC may be disposed on the pad area PDA on the substrate 110. In detail, a portion of the printed circuit board FPC may overlap the pad area PDA. One end of the printed circuit board FPC may be electrically connected to pads disposed in the pad area PDA on the substrate 110, and the other end of the printed circuit board FPC may be electrically connected to an external device. That is, an electrical signal, voltage, and the like generated from the external device may be provided to the driving chip IC and the plurality of pixels PX through the printed circuit board FPC.

The driving chip IC may be disposed in the pad area PDA on the substrate 110. The driving chip IC may convert a digital data signal among electrical signals into an analog data signal and provide the analog data signal to the plurality of pixels PX. For example, the driving chip IC may be a data driver. In addition, the driving chip IC may provide a voltage (e.g., the high voltage) to the printed circuit board FPC.

However, in FIG. 1, the driving chip IC is shown as having a chip on plastic ("COP") structure or a chip on glass ("COG") structure directly disposed on the substrate 110, but the present invention is not limited thereto. For example, the driving chip IC may have a chip on film ("COF") structure disposed directly on a flexible film. In this case, the printed circuit board FPC may be electrically connected to the flexible film.

Figure 4:
FIG. 4 is a cross-sectional view illustrating a portion of a display area of the display device of FIG. 1.

FIG. 4 is a cross-sectional view illustrating a portion of a display area of the display device of FIG. 1.

Referring to FIG. 4, the display device 100 according to an embodiment of the present disclosure may include a substrate 110, a display layer 200, a thin film encapsulation structure 300, a touch sensing structure 400, a polarizing layer POL, and a cover window CW.

The substrate 110 may include a transparent or opaque material. The substrate 110 may be formed of a transparent resin substrate. For example, the transparent resin substrate that can be used as the substrate 110 may be a polyimide substrate. In this case, the polyimide substrate may include a first polyimide layer, a barrier film layer, a second polyimide layer, and the like.

The display layer 200 may be disposed on the substrate 110. The display layer 200 may include a semiconductor element, an insulating layer, a light emitting element, and the like. A detailed description of the components of the display layer 200 will be described later.

The thin film encapsulation structure 300 may be disposed on the display layer 200. The thin film encapsulation structure 300 may cover the display layer 200. The thin film encapsulation structure 300 may prevent the display layer 200 from being damaged by moisture, oxygen, and the like. A detailed description of the components of the thin film encapsulation structure 300 will be described later.

The touch sensing structure 400 may be disposed on the thin film encapsulation structure 300. The touch sensing structure 400 may acquire coordinate information according to an external input. For example, the touch sensing structure 400 may sense an external input using a mutual cap method or a self-cap method. A detailed description of the components of the touch sensing structure 400 will be described later.

The polarizing layer POL may be disposed on the touch sensing structure 400. The polarizing layer POL may block external light incident to the display device 100 from the outside.

The cover window CW may be disposed on the polarizing layer POL. For example, the cover window CW may be formed using tempered glass, reinforced plastic, and the like.

Figure 5:
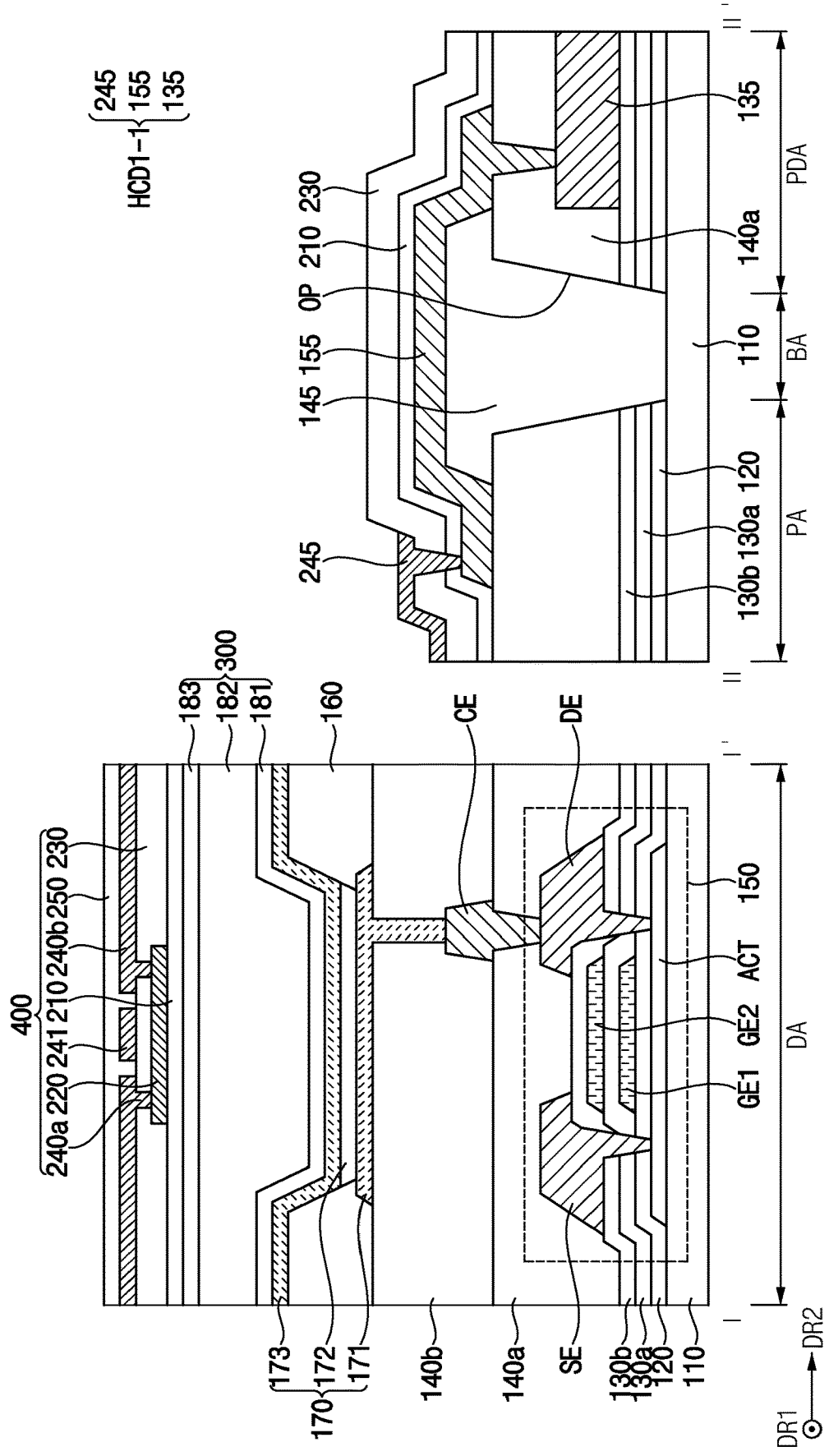
FIG. 5 is a cross-sectional view taken along lines I-I' and II-II' of FIG. 1.
Figure 6:
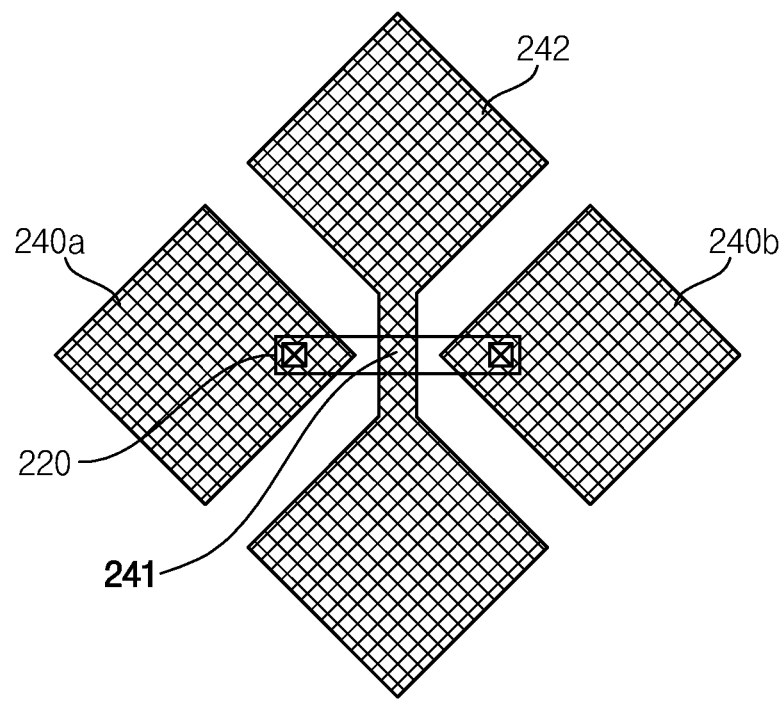
FIG. 6 is a plan view illustrating a touch sensing structure included in the display device of FIG. 5.

FIG. 5 is a cross-sectional view taken along lines I-I' and II-II' of FIG. 1. FIG. 6 is a plan view illustrating a touch sensing structure included in the display device of FIG. 5.

Referring to FIGS. 5 and 6, the display device 100 according to an embodiment may include the substrate 110, a gate insulating layer 120, a first interlayer insulating layer 130a, a second interlayer insulating layer 130b, a semiconductor element 150, a first planarization layer 140a, a second planarization layer 140b, a connection electrode CE, a pixel defining layer 160, a light emitting element 170, the thin film encapsulation structure 300, the touch sensing structure 400 and the (1-1)-th hole crack detection line HCD1-1.

Here, the semiconductor element 150 may include an active layer ACT, a first gate electrode GE1, a second gate electrode GE2, a source electrode SE, and a drain electrode DE, and a light emitting element 170 may include a lower electrode 171, a light emitting layer 172, and an upper electrode 173. The thin film encapsulation structure 300 may include a first inorganic thin film encapsulation layer 181, an organic thin film encapsulation layer 182, and a second inorganic thin film encapsulation layer 183, and the touch sensing structure 400 may include a sensing connection pattern 220, a first sensing electrode pattern 240a, a second sensing electrode pattern 240b, and a connection portion 241. The (1-1)-th hole crack detection line HCD1-1 may include a first conductive pattern 135, a bridge pattern 155, and a second conductive pattern 245.

As described above, the display device 100 may include the display area DA, the hole area HA, the peripheral area PA, the bending area BA, and the pad area PDA. As the display device 100 includes the display area DA, the hole area HA, the peripheral area PA, the bending area BA, and the pad area PDA, the substrate 110 may also include the display area DA, the hole area HA, the peripheral area PA, the bending area BA, and the pad area PDA.

A buffer layer (not shown) may be disposed on the substrate 110. The buffer layer may prevent diffusion of metal atoms or impurities from the substrate 110 to an upper structure (e.g., the semiconductor element 150, the light emitting element 170, and the like). The buffer layer may control a heat transfer rate during a crystallization process for forming the active layer ACT to obtain a substantially uniform active layer ACT. In addition, when a surface of the substrate 110 is not uniform, the buffer layer may serve to improve the flatness of the surface of the substrate 110. For example, the buffer layer may include an organic insulating material or an inorganic insulating material.

The active layer ACT may be disposed in the display area DA on the substrate 110 or on the buffer layer. The active layer ACT may include a metal oxide semiconductor, an inorganic semiconductor (e.g., amorphous silicon, polysilicon), or an organic semiconductor. The active layer ACT may include a source region, a drain region, and a channel region positioned between the source region and the drain region.

The gate insulating layer 120 may be disposed in the display area DA, the peripheral area PA, and the pad area PDA on the substrate 110. The gate insulating layer 120 may have an opening exposing an upper surface of the substrate 110 positioned in the bending area BA. The gate insulating layer 120 may cover the active layer ACT on the substrate 110 and may be disposed along a profile of the active layer ACT with a uniform thickness. Alternatively, the gate insulating layer 120 may sufficiently cover the active layer ACT on the substrate 110, and may have a substantially flat upper surface without creating a step around the active layer ACT. The gate insulating layer 120 may include a silicon compound, a metal oxide, and the like. For example, the gate insulating layer 120 may include silicon oxide ($SiO_x$), silicon nitride ($SiN_x$), silicon carbide ($SiC_x$), silicon oxynitride ($SiO_xN_y$), silicon oxycarbide ($SiO_xC_y$), and the like. These may be used alone or in combination with each other.

The first gate electrode GE1 may be disposed in the display area DA on the gate insulating layer 120. The first gate electrode GE1 may overlap the channel region of the active layer ACT. For example, the first gate electrode GE1 may include a metal, a metal alloy, a metal nitride, a conductive metal oxide, a transparent conductive material, and the like. These may be used alone or in combination with each other.

The first interlayer insulating layer 130a may be disposed in the display area DA, the peripheral area PA, and the pad area PDA on the gate insulating layer 120. The first interlayer insulating layer 130a may have an opening exposing an upper surface of the substrate 110 positioned in the bending area BA. The first interlayer insulating layer 130a may cover the first gate electrode GE1 and may be disposed to have a uniform thickness. Alternatively, the first interlayer insulating layer 130a may have a substantially flat upper surface on the gate insulating layer 120 without creating a step around the first gate electrode GE1. For example, the first interlayer insulating layer 130a may include a silicon compound, a metal oxide, and the like.

The second gate electrode GE2 may be disposed in the display area DA on the first interlayer insulating layer 130a. That is, the second gate electrode GE2 may overlap the first gate electrode GE1. For example, the second gate electrode GE2 may include a metal, a metal alloy, a metal nitride, a conductive metal oxide, a transparent conductive material, and the like. These may be used alone or in combination with each other.

The second interlayer insulating layer 130b may be disposed in the display area DA, the peripheral area PA, and the pad area PDA on the first interlayer insulating layer 130a. The second interlayer insulating layer 130b may have an opening exposing a upper surface of the substrate 110 positioned in the bending area BA. The second interlayer insulating layer 130b may cover the second gate electrode GE2 and may be disposed to have a uniform thickness. Alternatively, the second interlayer insulating layer 130b may have a substantially flat upper surface on the first interlayer insulating layer 130a without creating a step around the second gate electrode GE2. For example, the second interlayer insulating layer 130b may include a silicon compound, a metal oxide, and the like.

The source electrode SE and the drain electrode DE may be disposed in the display area DA on the second interlayer insulating layer 130b. The source electrode SE may be connected to the source region of the active layer ACT through a contact hole formed by removing a first portion of the gate insulating layer 120, the first interlayer insulating layer 130a, and the second interlayer insulating layer 130b. The drain electrode DE may be connected to the drain region of the active layer ACT through a contact hole formed by removing a second portion of the gate insulating layer 120, the first interlayer insulating layer 130a, and the second interlayer insulating layer 130b. For example, each of the source electrode SE and the drain electrode DE may include a metal, a metal alloy, a metal nitride, a conductive metal oxide, a transparent conductive material, and the like. These may be used alone or in combination with each other.

The first conductive pattern 135 may be disposed in the pad area PDA on the second interlayer insulating layer 130b. For example, the first conductive pattern 135 may include a metal, a metal alloy, a metal nitride, a conductive metal oxide, a transparent conductive material, and the like. These may be used alone or in combination with each other. In an embodiment, the first conductive pattern 135 may be disposed on the same layer as the source electrode SE and the drain electrode DE. That is, the first conductive pattern 135 may include the same material as the source electrode SE and the drain electrode DE. In another embodiment, the first conductive pattern 135 may be disposed on the same layer as the first gate electrode GE1 or the second gate electrode GE2.

The first planarization layer 140a may be disposed in the display area DA, the peripheral area PA, and the pad area PDA on the second interlayer insulating layer 130b. The first planarization layer 140a may have an opening exposing an upper surface of the substrate 110 positioned in the bending area BA. For example, the first planarization layer 140a may be disposed to have a relatively thick thickness to sufficiently cover the source electrode SE, the drain electrode DE, and the first conductive pattern 135 on the second interlayer insulating layer 130b. In this case, the first planarization layer 140a may have a substantially flat upper surface, and a planarization process may be added to the first planarization layer 140a in order to implement a flat upper surface of the first planarization layer 140a. The first planarization layer 140a may have a first contact hole exposing an upper surface of the drain electrode DE in the display area DA and may have a second contact hole exposing an upper surface of the first conductive pattern 135 in the pad area PDA.

The first planarization layer 140a may include an organic insulating material or an inorganic insulating material. In an embodiment, the first planarization layer 140a may include an organic insulating material. For example, the first planarization layer 140a may include a photoresist, a polyacryl-based resin, a polyimide-based resin, a polyamide-based resin, a siloxane-based resin, an acryl-based resin, an epoxy-based resin, and the like. These may be used alone or in combination with each other.

The organic layer 145 may be disposed in the bending area BA on the substrate 110. The organic layer 145 may fill the opening of each of the gate insulating layer 120, the first interlayer insulating layer 130a, the second interlayer insulating layer 130b, and the first planarization layer 140a. The organic layer 145 may relieve stress in the bending area BA. For example, the organic layer 145 may include a photoresist, a polyacrylic resin, a polyimide-based resin, a polyamide-based resin, a siloxane-based resin, an acrylic resin, an epoxy-based resin, and the like. These may be used alone or in combination with each other.

The connection electrode CE may be disposed in the display area DA on the first planarization layer 140a. The connection electrode CE may be connected to the drain electrode DE through the first contact hole of the first planarization layer 140a. For example, the connection electrode CE may include a metal, a metal alloy, a metal nitride, a conductive metal oxide, a transparent conductive material, and the like. These may be used alone or in combination with each other.

The bridge pattern 155 may be disposed in the bending area BA on the organic layer 145. The bridge pattern 155 may extend to a portion of the peripheral area PA and a portion of the pad area PDA. The bridge pattern 155 may be connected to the first conductive pattern 135 through the second contact hole of the first planarization layer 140a. For example, the bridge pattern 155 may include a metal, a metal alloy, a metal nitride, a conductive metal oxide, a transparent conductive material, and the like. These may be used alone or in combination with each other. In an embodiment, the bridge pattern 155 may be disposed on the same layer as the connection electrode CE. That is, the bridge pattern 155 may include the same material as the connection electrode CE.

The second planarization layer 140b may be disposed in the display area DA on the first planarization layer 140a. That is, the second planarization layer 140b may not be disposed in the peripheral area PA and the pad area PDA. For example, the second planarization layer 140b may be disposed to have a relatively thick thickness to sufficiently cover the connection electrode CE on the first planarization layer 140a. In this case, the second planarization layer 140b may have a substantially flat upper surface, and a planarization process may be added to the second planarization layer 140b in order to implement a flat upper surface of the second planarization layer 140b. In addition, the second planarization layer 140b may have a contact hole exposing an upper surface of the connection electrode CE. For example, the second planarization layer 140b may include an organic insulating material or an inorganic insulating material.

The lower electrode 171 may be disposed in the display area DA on the second planarization layer 140b. The lower electrode 171 may be connected to the connection electrode CE through the contact hole formed in the second planarization layer 140b. Accordingly, the lower electrode 171 may be electrically connected to the semiconductor element 150. For example, the lower electrode 171 may include a metal, a metal alloy, a metal nitride, a conductive metal oxide, a transparent conductive material, and the like. These may be used alone or in combination with each other.

The pixel defining layer 160 may be disposed in the display area DA on the second planarization layer 140b. The pixel defining layer 160 may cover sides of the lower electrode 171, and may have an opening exposing an upper surface of the lower electrode 171. For example, the pixel defining layer 160 may include an organic insulating material or an inorganic insulating material. In an embodiment, the pixel defining layer 160 may include an organic insulating material.

The light emitting layer 172 may be disposed in the display area DA on the lower electrode 171. That is, the light emitting layer 172 may be disposed on the lower electrode 171 exposed by the opening of the pixel defining layer 160. The light emitting layer 172 may be formed using at least one of light emitting materials capable of emitting red light, green light, blue light, and the like depending on the type of sub-pixel. Alternatively, the light emitting layer 172 may emit white light as a whole by stacking a plurality of light emitting materials capable of generating light of different colors, such as red light, green light, and blue light.

The upper electrode 173 may be disposed in the display area DA on the pixel defining layer 160 and the light emitting layer 172. For example, the upper electrode 173 may include a metal, a metal alloy, a metal nitride, a conductive metal oxide, a transparent conductive material, and the like. These may be used alone or in combination with each other.

Accordingly, the light emitting element 170 including the lower electrode 171, the light emitting layer 172, and the upper electrode 173 may be disposed in the display area DA on the substrate 110.

The first inorganic thin film encapsulation layer 181 may be disposed in the display area DA on the upper electrode 173. The first inorganic thin film encapsulation layer 181 may cover the upper electrode 173 and may be disposed along a profile of the upper electrode 173 with a uniform thickness. The first inorganic thin film encapsulation layer 181 may prevent the light emitting element 170 from being deteriorated due to penetration of moisture, oxygen, and the like. In addition, the first inorganic thin film encapsulation layer 181 may also function to protect the light emitting element 170 from external impact. For example, the first inorganic thin film encapsulation layer 181 may include an inorganic insulating material having flexibility.

The organic thin film encapsulation layer 182 may be disposed on the first inorganic thin film encapsulation layer 181. The organic thin film encapsulation layer 182 may improve the flatness of the display device 100, and may protect the light emitting element 170 together with the first inorganic thin film encapsulation layer 181. For example, the organic thin film encapsulation layer 182 may include an organic material having flexibility.

The second inorganic thin film encapsulation layer 183 may be disposed on the organic thin film encapsulation layer 182. The second inorganic thin film encapsulation layer 183 may cover the organic thin film encapsulation layer 182, and may be disposed along a profile of the organic thin film encapsulation layer 182 with a uniform thickness. The second inorganic thin film encapsulation layer 183 together with the first inorganic thin film encapsulation layer 181 may prevent the light emitting element 170 from being deteriorated due to penetration of moisture, oxygen, and the like. In addition, the second inorganic thin film encapsulation layer 183 together with the first inorganic thin film encapsulation layer 181 and the organic thin film encapsulation layer 182 may also function to protect the light emitting element 170 from external impact. For example, the second inorganic thin film encapsulation layer 183 may include an inorganic insulating material having flexibility.

Alternatively, the thin film encapsulation structure 300 may have a five-layer structure in which three inorganic thin film encapsulation layers and two organic thin film encapsulation layers are stacked or may have a seven-layer structure in which four inorganic thin film encapsulation layers and three organic thin film encapsulation layers are stacked.

The lower touch insulating layer 210 may be disposed in the display area DA on the second inorganic thin film encapsulation layer 183. The lower touch insulating layer 210 may extend to the peripheral area PA, the bending area BA, and the pad area PDA. For example, the lower touch insulating layer 210 may include an inorganic insulating material or an organic insulating material. Alternatively, the lower touch insulating layer 210 may have a multilayer structure including a plurality of insulating layers. For example, the insulating layers may have different thicknesses or may include different materials.

The sensing connection pattern 220 may be disposed in the display area DA on the lower touch insulating layer 210. As illustrated in FIG. 6, The sensing connection pattern 220 may electrically connect the first sensing electrode pattern 240a and the second sensing electrode pattern 240b through contact holes. For example, the sensing connection pattern 220 may include a metal, an alloy, a metal nitride, a conductive metal oxide, a transparent conductive material, and the like. These may be used alone or in combination with each other.

The sensing connection pattern 220 and the first and second sensing electrode patterns 240a and 240b may include the same material. Alternatively, the sensing connection pattern 220 and the first and second sensing electrode patterns 240a and 240b may include different materials.

The interlayer touch insulating layer 230 may be disposed in the display area DA, the peripheral area PA, the bending area BA, and the pad area PDA on the lower touch insulating layer 210. The interlayer touch insulating layer 230 may sufficiently cover the sensing connection pattern 220. For example, the interlayer touch insulating layer 230 may include an organic insulating material or an inorganic insulating material. Alternatively, the interlayer touch insulating layer 230 may have a multilayer structure including a plurality of insulating layers. For example, the insulating layers may have different thicknesses or may include different materials.

The first sensing electrode pattern 240a, the second sensing electrode pattern 240b, and the connection portion 241 may be disposed in the display area DA on the interlayer touch insulating layer 230. In addition, as illustrated in FIG. 6, a third sensing electrode pattern 242 may be disposed in the display area DA on the interlayer touch insulating layer 230, and the third sensing electrode pattern 242 may be disposed on the same layer as the connection portion 241. In and embodiment, each of the first sensing electrode pattern 240a, the second sensing electrode pattern 240b, the third sensing electrode pattern 242, and the connection portion 241 may include a carbon nano tube ("CNT"), transparent conductive oxide, indium tin oxide ("ITO"), indium gallium zinc oxide ("IGZO"), zinc oxide ("ZnO"), graphene, Ag nanowire ("AgNW"), copper ("Cu"), chromium ("Cr"), titanium ("Ti"), aluminum ("Al"), and the like. These may be used alone or in combination with each other. For example, each of the first sensing electrode pattern 240a, the second sensing electrode pattern 240b, the third sensing electrode pattern 242, and the connection portion 241 may have a multilayer structure including Ti/Al/Ti.

For example, the first sensing electrode pattern 240a and the second sensing electrode pattern 240b may include an electrode pattern array arranged to be spaced apart from each other in the second direction D2. In addition, the third sensing electrode pattern 242 may include an electrode pattern array that extends in the second direction D2 and is spaced apart from each other in the first direction D1.

The second conductive pattern 245 may be disposed in the peripheral area PA on the interlayer touch insulating layer 230. The second conductive pattern 245 may be connected to the bridge pattern 155 through a contact hole formed in the lower touch insulating layer 210 and the interlayer touch insulating layer 230. In an embodiment, the second conductive pattern 245 may be disposed on the same layer as and may be formed at the same time with the first sensing electrode pattern 240a, the second sensing electrode pattern 240b, the third sensing electrode pattern 242, and the connection portion 241. That is, the second conductive pattern 245 may include the same material as the first sensing electrode pattern 240a. the second sensing electrode pattern 240b, the third sensing electrode pattern 242, and the connection part 241. In another embodiment, the second conductive pattern 245 may be disposed on the same layer as the sensing connection pattern 220.

Accordingly, the (1-1)-th hole crack detection line HCD1-1 including the first conductive pattern 135, the bridge pattern 155, and the second conductive pattern 245 may be disposed in the peripheral area PA, the bending area BA, and the pad area PDA on the substrate 110. However, although the (1-1)-th hole crack detection line HCD1-1 has been described as an example in FIG. 5, the present disclosure is not limited thereto. For example, each of the (1-2)-th hole crack detection line HCD1-2, the (2-1)-th hole crack detection line HCD2-1, and the (2-2)-th hole crack detection line HCD2-2 illustrated in FIG. 1 may include the same components as the (1-1)-th hole crack detection line HCD1-1.

The protective layer 250 may be disposed in the display area DA on the interlayer touch insulating layer 230, the first sensing electrode pattern 240a, the second sensing electrode pattern 240b, and the connection portion 241. The protective layer 250 may sufficiently cover the first sensing electrode pattern 240a, the second sensing electrode pattern 240b, and the connection portion 241.

The touch insulating structure 400 of the present disclosure is not limited to the structure illustrated in FIGS. 5 and 6, and may have various known structures. For example, in other embodiments, the lower touch insulating layer 210 may be omitted. In addition, the first and second sensing electrode patterns 240a and 240b and the third sensing electrode pattern 242 may be disposed on different layers, so that the first and second sensing electrode patterns 240a and 240b may have a continuous structure without the sensing connection pattern 220.

In addition, although the display device 100 of the present disclosure is described as the organic light emitting display device, the configuration of the present disclosure is not limited thereto. In other embodiments, the display device 100 may include a liquid crystal display device ("LCD"), a field emission display device ("FED"), a plasma display device ("PDP"), an electrophoretic image display device ("EPD"), an inorganic light emitting display device ("ILED"), or a quantum dot display device.

Figure 7:
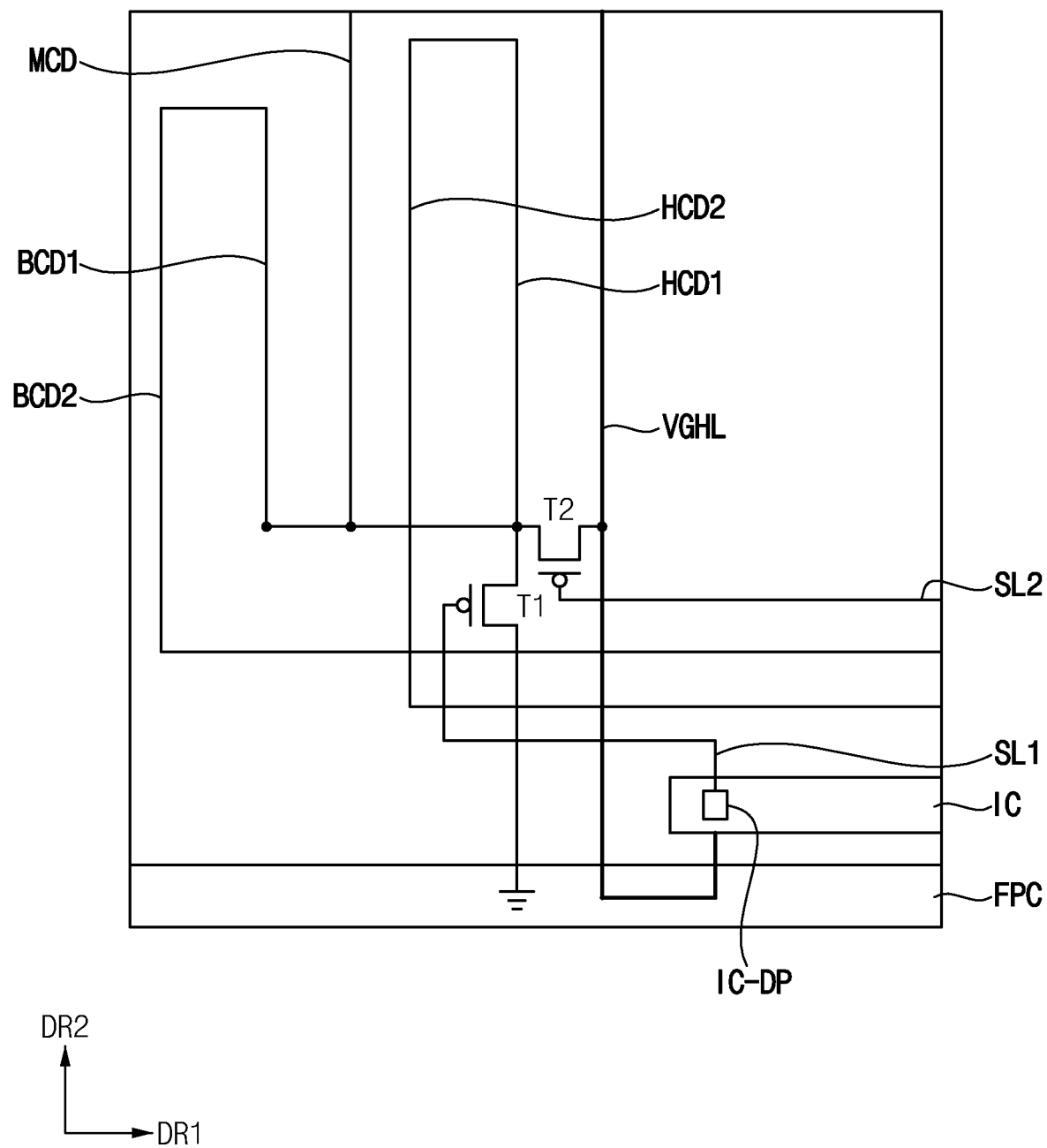
FIGS. 7 and 8 are diagrams schematically illustrating a circuit structure for explaining a normal mode and an inspection mode of the display device of FIG. 1.
Figure 8:
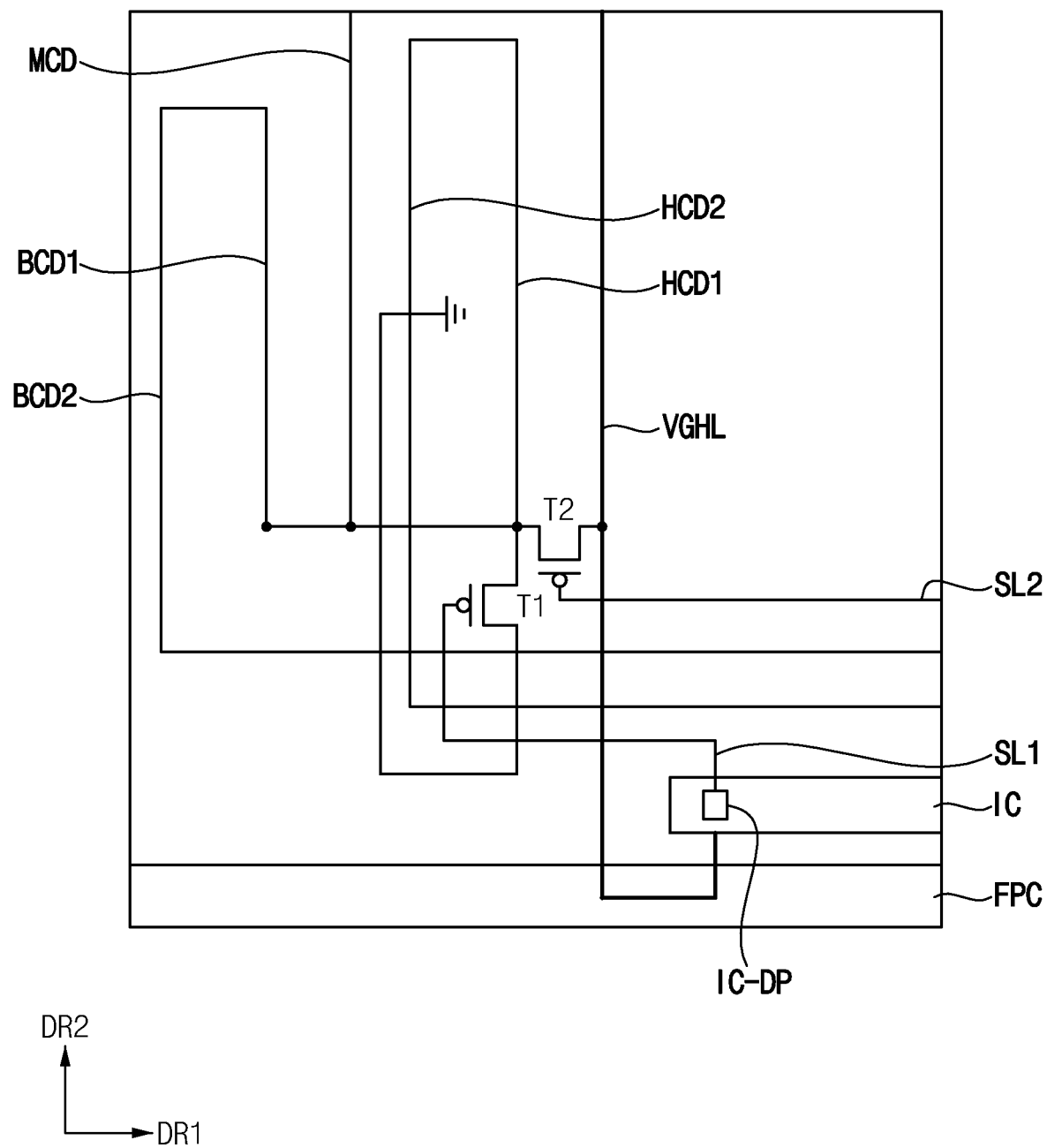

FIGS. 7 and 8 are diagrams schematically illustrating a circuit structure for explaining a normal mode and an inspection mode of the display device of FIG. 1.

Referring to FIGS. 1, 7, and 8, the display device 100 according to an embodiment may include the substrate 110, the plurality of pixels PX, the first detection line M1, the second detection line M2, the third detection line M3, the driving chip IC, and the printed circuit board FPC.

Here, the first detection line M1 may include the (1-1)-th hole crack detection line HCD1-1 and the (2-1)-th hole crack detection line HCD2-1, and the second detection line M2 may include the (1-2)-th hole crack detection line HCD1-2 and the (2-2)-th hole crack detection line HCD2-2. The (1-1)-th hole crack detection line HCD1-1 and the (1-2)-th hole crack detection line HCD1-2 may be defined as a first hole crack detection line HCD1, and the (2-1)-th hole crack detection line HCD2-1 and the (2-2)-th second hole crack detection line HCD2-2 may be defined as a second hole crack detection line HCD2.

The display device 100 according to an embodiment of the present disclosure may include a first bending crack detection line BCD1, a second bending crack detection line BCD2, a module crack detection line MCD, a first signal line SL1, a second signal line SL2, a high voltage line VGHL, a first transistor T1, and a second transistor T2.

The first bending crack detection line BCD1 and the second bending crack detection line BCD2 may inspect crack occurring in a bending area (e.g., the bending area BA of FIG. 1). The module crack detection line MCD may inspect crack occurring in an outermost area of the display device 100.

The second hole crack detection line HCD2 may be electrically connected to the first hole crack detection line HCD1. The first bending crack detection line BCD1 may be connected to the module crack detection line MCD. The second bending crack detection line BCD2 may be provided integrally with the first bending crack detection line BCD1. The module crack detection line MCD may be connected to the first hole crack detection wiring HCD1. The high voltage line VGHL may be connected to the driving chip IC and the printed circuit board FPC. The driving chip IC may provide a high voltage to the high voltage line VGHL through the printed circuit board FPC to the high voltage line VGHL.

The first signal line SL1 may be connected to the driving chip IC. Specifically, the first signal line SL1 may be connected to a driving dummy pad IC-DP included in the driving chip IC. The driving chip IC may provide a first signal to the first signal line SL1.

The first transistor T1 may include a first electrode, a second electrode, and a gate electrode. The first electrode of the first transistor T1 may be connected to the printed circuit board FPC. In an embodiment, the first electrode of the first transistor T1 may be connected to a ground line of the printed circuit board FPC (refer to FIG. 7). In another embodiment, the first electrode of the first transistor T1 may be connected to a ground line disposed in the display area DA (refer to FIG. 8). The second electrode of the first transistor T1 may be connected to a node to which a second electrode of the second transistor T2 is connected. The gate electrode of the first transistor T1 may be connected to the first signal line SL1. The first signal may be applied to the gate electrode of the first transistor T1 through the first signal line SL1.

The second transistor T2 may include a first electrode, a second electrode, and a gate electrode. The first electrode of the second transistor T2 may be connected to the high voltage line VGHL. The second electrode of the second transistor T2 may be connected to the node to which the first electrode of the first transistor T1 is connected. The gate electrode of the second transistor T2 may be connected to the second signal line SL2. A second signal may be applied to the gate electrode of the second transistor T2 through the second signal line SL2.

The display device 100 may be driven in the normal mode, which is a mode generally used by a user, or the inspection mode in which crack formed in the hole area HA are inspected. Hereinafter, the normal mode and the inspection mode will be described.

When the display device 100 is driven in the normal mode, the first transistor T1 may be turned on by the first signal provided through the first signal line SL1 and the second transistor T2 may be turned off by the second signal provided through the second signal line SL2. In this case, the first signal may have a low level, and the second signal may have a high level. Accordingly, when the display device 100 is driven in the normal mode, a ground voltage may be applied to the first hole crack detection line HCD1 and the second hole crack detection line HCD2 through the printed circuit board FPC. Alternatively, when the display device 100 is driven in the normal mode, the first hole crack detection line HCD1 and the second hole crack detection line HCD2 may be in a floating state. Alternatively, when the display device 100 is driven in the normal mode, a low voltage may be applied to the first hole crack detection line HCD1 and the second hole crack detection line HCD2 through the printed circuit board FPC.

When the display device 100 is driven in the inspection mode, the first transistor T1 may be turned off by the first signal provided through the first signal line SL1, and the second transistor T2 may be turned on by the second signal provided through the second signal line SL2. In this case, the first signal may have a high level, and the second signal may have a low level. Accordingly, when the display device 100 is driven in the inspection mode, a high voltage may be applied to the first hole crack detection line HCD1 and the second hole crack detection line HCD2 through the high voltage line VGHL.

According to a comparative example, when the display device 100 is driven in the normal mode, which is a mode generally used by a user, the high voltage may be applied to the first and second hole crack detection lines HCD1 and HCD2. In this case, as iodine in the polarizing layer POL of FIG. 4 is diffused into the first and second hole crack detection lines HCD1 and HCD2 in a high temperature and high humidity environment and a general user environment, corrosion of the first and second hole crack detection lines HCD1 and HCD2 may occur. In addition, corrosion of driving signal lines positioned adjacent to the first and second hole crack detection lines HCD1 and HCD2 may occur due to the iodine diffused into the driving signal lines.

In the display device 100 according to an embodiment of the present disclosure, when the display device 100 is driven in the normal mode, which is a mode generally used by a user, the low voltage may be applied to the first hole crack detection line HCD1 and the second hole crack detection line HCD2, when the display device 100 is driven in the inspection mode for inspecting crack formed in a hole area, the high voltage may be applied to the first hole crack detection line HCD1 and the second hole crack detection line HCD2. Accordingly, corrosion of the first and second hole crack detection lines HCD1 and HCD2 for inspecting a crack formed in a hole area (e.g., the hole area HA of FIG. 1) of the display device 100 that may occur when driving for a long time in a high temperature and high humidity environment and a general user environment may be improved. In addition, corrosion of the driving signal lines positioned adjacent to the first and second hole crack detection lines HCD1 and HCD2 caused by driving for a long time in a high temperature and high humidity environment and a general user environment may be improved.

Figure 9:
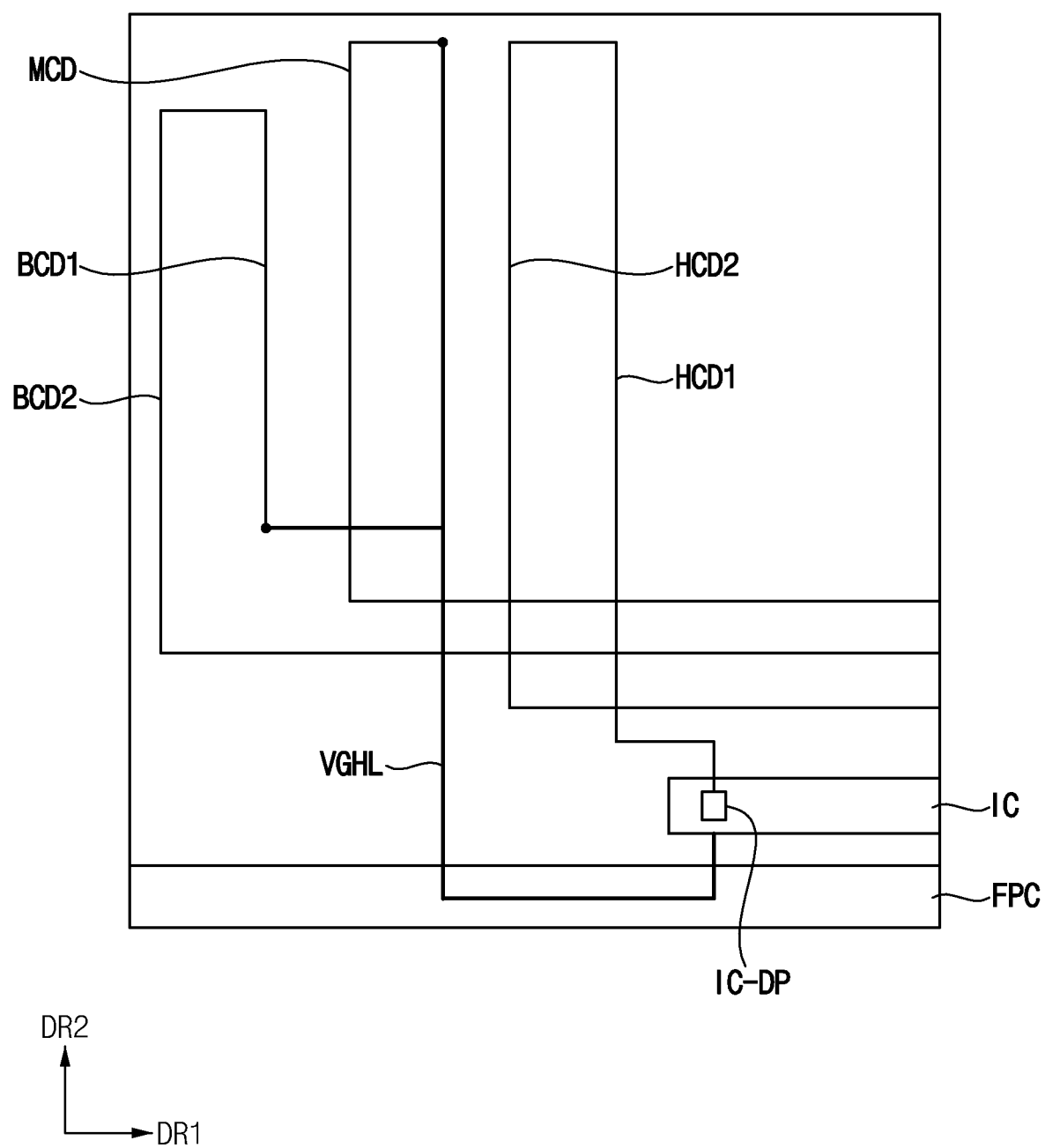
FIG. 9 is a diagram schematically illustrating a circuit structure for explaining a normal mode and an inspection mode of a display device according to another embodiment of the present disclosure.

FIG. 9 is a diagram schematically illustrating a circuit structure for explaining a normal mode and an inspection mode of a display device according to another embodiment of the present disclosure.

Referring to FIGS. 1 and 9, a display device according to another embodiment of the present disclosure may include a substrate 110, a plurality of pixels PX, a first detection line M1, a second detection line M2, a third detection line M3, a driving chip IC, and a printed circuit board FPC. Hereinafter, descriptions that overlap with the display device 100 described with reference to FIGS. 1, 7, and 8 will be omitted.

The display device according to another embodiment of the present disclosure may further include a first bending crack detection line BCD1, a second bending crack detection line BCD2, a module crack detection line MCD, and a high voltage line VGHL.

The second hole crack detection line HCD2 may be electrically connected to the first hole crack detection line HCD1. The first bending crack detection line BCD1 may be connected to the high voltage line VGHL. The second bending crack detection line BCD2 may be provided integrally with the first bending crack detection line BCD1. The module crack detection line MCD may be connected to the high voltage line VGHL. The high voltage line VGHL may be connected to the driving chip IC and the printed circuit board FPC. The driving chip IC may provide a high voltage to the high voltage line VGHL through the printed circuit board FPC.

The first hole crack detection line HCD1 may be directly connected to the driving chip IC. Specifically, the first hole crack detection line HCD1 may be directly connected to the driving dummy pad IC-DP included in the driving chip IC. In an embodiment, the driving chip IC may provide a voltage (e.g., a low voltage, a high voltage, or the like) to the first hole crack detection line HCD1. In another embodiment, the driving chip IC and the driving dummy pattern IC-DP may not be electrically connected. In this case, the first hole crack detection line HCD1 and the second hole crack detection line HCD2 may be in a floating state. In another embodiment, the first hole crack detection line HCD1 may be connected to a ground of the driving chip IC.

The display device may be driven in a normal mode, which is a mode generally used by a user, or an inspection mode in which crack of the hole formed in the hole area HA are inspected. Hereinafter, the normal mode and the inspection mode will be described.

When the display device is driven in the normal mode, a low voltage may be applied to the first hole crack detection line HCD1 and the second hole crack detection line HCD2 through the driving chip IC. Alternatively, when the display device is driven in the normal mode, the first hole crack detection line HCD1 and the second hole crack detection line HCD2 may be in a floating state. Alternatively, when the display device is driven in the normal mode, the first hole crack detection line HCD1 and the second hole crack detection line HCD2 may be connected to the ground of the driving chip IC. In this case, a ground voltage may be applied to the first hole crack detection line HCD1 and the second hole crack detection line HCD2 through the driving chip IC.

When the display device is driven in the inspection mode, the high voltage may be applied to the first hole crack detection line HCD1 and the second hole crack detection line HCD2 through the driving chip IC.

Accordingly, when the display device is driven in the normal mode, the low voltage may be applied to the first hole crack detection line HCD1 and the second hole crack detection line HCD2, and, when the display device is driven the inspection mode, the high voltage may be applied to the first hole crack detection line HCD1 and the second hole crack detection line HCD2.

Figure 10:
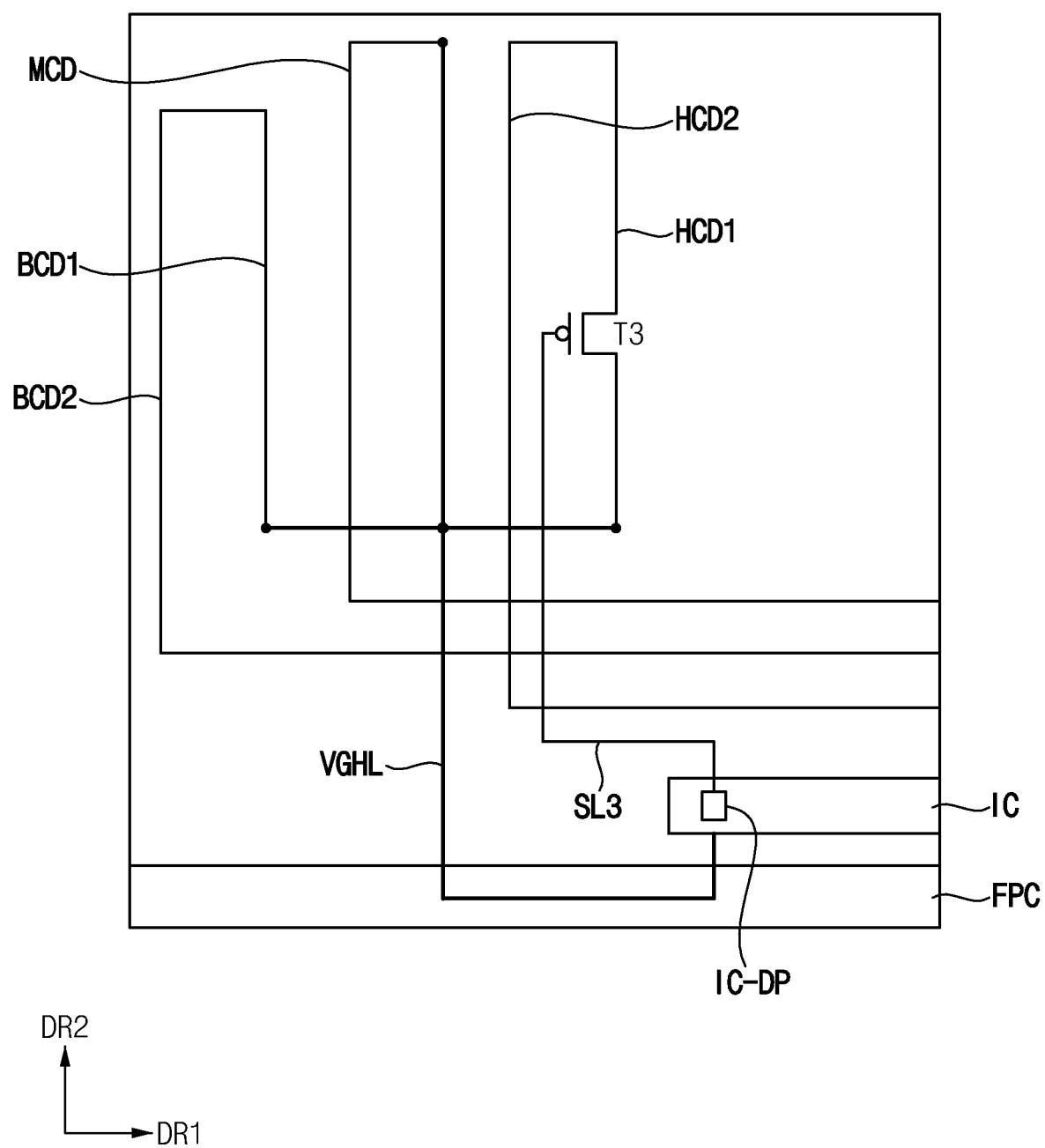
FIG. 10 is a diagram schematically illustrating a circuit structure for explaining a normal mode and an inspection mode of a display device according to still another embodiment of the present disclosure.

FIG. 10 is a diagram schematically illustrating a circuit structure for explaining a normal mode and an inspection mode of a display device according to still another embodiment of the present disclosure.

Referring to FIGS. 1 and 10, a display device according to still another embodiment of the present disclosure may include a substrate 110, a plurality of pixels PX, a first detection line M1, a second detection line M2, a third detection line M3, a driving chip IC, and a printed circuit board FPC. Hereinafter, descriptions that overlap with the display device 100 described with reference to FIGS. 1, 7, and 8 will be omitted.

The display device according to still another embodiment of the present disclosure may include a first bending crack detection line BCD1, a second bending crack detection line BCD2, a module crack detection line MCD, a high voltage line VGHL, a third transistor T3 and a third signal line SL3.

The second hole crack detection line HCD2 may be electrically connected to the first hole crack detection line HCD1. The first bending crack detection line BCD1 may be connected to the high voltage line VGHL. The second bending crack detection line BCD2 may be provided integrally with the first bending crack detection line BCD1. The module crack detection line MCD may be connected to the high voltage line VGHL. The high voltage line VGHL may be connected to the driving chip IC and the printed circuit board FPC. The driving chip IC may provide a high voltage to the high voltage line VGHL through the printed circuit board FPC.

The third signal line SL3 may be connected to the driving chip IC. Specifically, the third signal line SL3 may be connected to a driving dummy pad IC-DP included in the driving chip IC. The driving chip IC may provide a third signal to the third signal line SL3.

The third transistor T3 may include a first electrode, a second electrode, and a gate electrode. The first electrode of the third transistor T3 may be connected to the high voltage line VGHL. The second electrode of the third transistor T3 may be connected to the first hole crack detection line HCD1. The gate electrode of the third transistor T3 may be connected to the third signal line CL3. The third signal may be applied to the gate electrode of the third transistor T3 through the third signal line SL3.

The display device may be driven in a normal mode, which is a mode generally used by a user, or an inspection mode in which crack of the hole formed in the hole area HA is inspected. Hereinafter, the normal mode and the inspection mode will be described.

When the display device is driven in the normal mode, the third transistor T3 may be turned off by the third signal provided through the third signal line SL3. In this case, the third signal may have a high level. Accordingly, when the display device is driven in the normal mode, the first hole crack detection line HCD1 and the second hole crack detection line HCD2 may be in a floating state.

When the display device is driven in the inspection mode, the third transistor T3 may be turned on by the third signal provided through the third signal line SL3. In this case, the third signal may have a low level. Accordingly, when the display device is driven in the inspection mode, the high voltage may be applied to the first hole crack detection line HCD1 and the second hole crack detection line HCD2 through the high voltage line VGHL.

Accordingly, when the display device is driven in the normal mode, the first hole crack detection line HCD1 and the second hole crack detection line HCD2 may be in a floating state, and when the display device is driven in the inspection mode, the high voltage may be applied to the first hole crack detection line HCD1 and the second hole crack detection line HCD2.

The present disclosure can be applied to various display devices. For example, the present disclosure is applicable to various display devices such as display devices for vehicles, ships and aircraft, portable communication devices, display devices for exhibition or information transmission, medical display devices, and the like.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A display device comprising:
   a substrate including a display area on which a plurality of pixels are disposed, a hole area disposed in the display area, a peripheral area surrounding the display area, a pad area, and a bending area positioned between the peripheral area and the pad area in a plan view;
   a printed circuit board disposed on the pad area on the substrate;
   a first hole crack detection line disposed in the peripheral area on the substrate and extending from the peripheral area to the bending area and the pad area;
   a second hole crack detection line disposed in the peripheral area on the substrate, extending from the peripheral area to the bending area and the pad area, and electrically connected to the first hole crack detection line;
   a first transistor including a gate electrode connected to a first signal line to receive a first signal, a first electrode, and a second electrode connected to the first hole crack detection line; and
   a second transistor including a gate electrode connected to a second signal line to receive a second signal, a first electrode connected to a high voltage line for applying a high voltage, and a second electrode connected to the first hole crack detection line.

2. The display device of claim 1, wherein when the display device is driven in a normal mode,
   a first signal having a low level is applied to the gate electrode of the first transistor through the first signal line so that the first transistor is turned on, and
   a second signal having a high level is applied to the gate electrode of the second transistor through the second signal line so that the second transistor is turned off.

3. The display device of claim 2, wherein the first electrode of the first transistor is connected to a ground line of the printed circuit board, and
   wherein, when the display device is driven in the normal mode, a ground voltage is applied to the first hole crack detection line and the second hole crack detection line through the printed circuit board.

4. The display device of claim 2, wherein, when the display device is driven in the normal mode, a low voltage is applied to the first hole crack detection line and the second hole crack detection line through the printed circuit board.

5. The display device of claim 2, wherein, when the display device is driven in the normal mode, the first hole crack detection line and the second hole crack detection line are in a floating state.

6. The display device of claim 1, wherein, when the display device is driven in an inspection mode,
   a first signal having a high level is applied to the gate electrode of the first transistor through the first signal line so that the first transistor is turned off, and
   a second signal having a low level is applied to the gate electrode of the second transistor through the second signal line so that the second transistor is turned on.

7. The display device of claim 6, wherein, when the display device is driven in the inspection mode, the high voltage is applied to the first hole crack detection line and the second hole detection line through the high voltage line.

8. The display device of claim 1, further comprising;
   a driving chip disposed in the pad area on the substrate;
   wherein the diving chip is connected to the first signal line that provides the first signal to the first signal line and that provides the high voltage to the high voltage line through the printed circuit board.

9. The display device of claim 8, further comprising;
   first connection lines disposed in the pad area on the substrate and that provides a data signal to the pixels through the driving chip; and
   a second connection line disposed in the pad area on the substrate and that provides a driving voltage to the pixels through the printed circuit board.

10. The display device of claim 9, wherein, in the pad area, the first hole crack detection line is disposed between the first connection lines and the second connection line in a plan view.

11. The display device of claim 1, further comprising;
a detection line disposed in the display area on the substrate, including a first end and a second end, and disposed adjacent to the hole area to surround a periphery of the hole area.

12. The display device of claim 11, wherein the first end of the detection line is electrically connected to the first hole crack detection line and the second end of the detection line is electrically connected to the second hole crack detection line.

13. The display device of claim 1, further comprising;
a semiconductor element including an active layer disposed in the display area on the substrate, a gate electrode overlapping a channel area of the active layer, a source electrode connected to a source area of the active layer, and a drain electrode connected to a drain area of the active layer;
a connection electrode disposed on the semiconductor element and connected to the semiconductor element; and
a touch sensing structure including a sensing connection pattern disposed on the connection electrode and a sensing electrode pattern disposed on the sensing connection pattern.

14. The display device of claim 13, wherein each of the first hole crack detection line and the second hole crack detection line includes:
a first conductive pattern disposed in the pad area on the substrate;
a bridge pattern disposed in the bending area on the substrate, extending to a portion of the peripheral area and a portion of the pad area, and connected to the first conductive pattern; and
a second conductive pattern disposed in peripheral area on the substrate and connected to the bridge pattern.

15. The display device of claim 14, wherein the first conductive pattern is disposed on a same layer as the source electrode and the drain electrode, the bridge pattern is disposed on a same layer as the connection electrode, the second conductive pattern is disposed on a same layer as the sensing electrode pattern.

16. A display device comprising:
a substrate including a display area on which a plurality of pixels are disposed, a hole area disposed in the display area, a peripheral area surrounding the display area, a pad area, and a bending area positioned between the peripheral area and the pad area in a plan view;
a driving chip disposed in the pad area on the substrate;
a first hole crack detection line disposed in the peripheral area on the substrate, extending from the peripheral area to the bending area and the pad area, and directly connected to the driving chip; and
a second hole crack detection line disposed in the peripheral area on the substrate, extending from the peripheral area to the bending area and the pad area, and electrically connected to the first hole crack detection line,
wherein, when the display device is driven in an inspection mode, a high voltage is applied to the first hole crack detection line and the second hole crack detection line through the driving chip.

17. The display device of claim 16, wherein, when the display device is driven in a normal mode, a low voltage is applied to the first hole crack detection line and the second hole crack detection line through the driving chip.

18. The display device of claim 16, wherein, when the display device is driven in a normal mode, the first hole crack detection line and the second hole crack detection line are connected to a ground line of the driving chip or are in a floating state.

19. A display device comprising:
a substrate including a display area on which a plurality of pixels are disposed, a hole area disposed in the display area, a peripheral area surrounding the display area, a pad area, and a bending area positioned between the peripheral area and the pad area in a plan view;
a first hole crack detection line disposed in the peripheral area on the substrate and extending from the peripheral area to the bending area and the pad area;
a second hole crack detection line disposed in the peripheral area on the substrate, extending from the peripheral area to the bending area and the pad area, and electrically connected to the first hole crack detection line; and
a transistor including a gate electrode connected to a signal line to receive a signal, a first electrode connected to a high voltage line for applying a high voltage, and a second electrode is connected to the first hole crack detection line.

20. The display device of claim 19, wherein, when the display device is driven in a normal mode, a signal having a high level is applied to the gate electrode of the transistor through the signal line so that the transistor is turned off.

21. The display device of claim 20, wherein, when the display device is driven in a normal mode, the first hole crack detection line and the second hole crack detection line are in a floating state.

22. The display device of claim 19, wherein, when the display device is driven in an inspection mode, a signal having a low level is applied to the gate electrode of the transistor through the signal line so that the transistor is turned on.

23. The display device of claim 22, wherein, when the display device is driven in an inspection mode, the high voltage is applied to the first hole crack detection line and the second hole crack detection line through the high voltage line.

24. The display device of claim 19, further comprising;
a driving chip disposed in the pad area on the substrate; and
a printed circuit board disposed on the pad area on the substrate,
wherein the driving chip is connected to the signal line that provides the signal to the signal line and that provides the high voltage to the high voltage line through the printed circuit board.

* * * * *